United States Patent [19]

Yamaguchi et al.

[11] Patent Number: 4,761,634
[45] Date of Patent: Aug. 2, 1988

[54] AD CONVERTING DEVICE

[75] Inventors: Takahiro Yamaguchi; Norio Arakawa; Takayuki Ohgami; Hiromi Kosawa, all of Gyoda, Japan

[73] Assignee: Advantest Corporation, Tokyo, Japan

[21] Appl. No.: 940,058

[22] Filed: Dec. 10, 1986

[30] Foreign Application Priority Data

Dec. 13, 1985 [JP] Japan .................................. 60-280652

[51] Int. Cl.$^4$ .............................................. H03M 1/06
[52] U.S. Cl. ......................... 340/347 AD; 340/347 CC
[58] Field of Search ................ 340/347 AD, 347 DA, 340/347 CC

[56] References Cited

U.S. PATENT DOCUMENTS

3,877,022 4/1975 Lehman ........................ 340/347 AD
4,550,309 10/1985 Hiller ............................ 340/347 AD Primary Examiner—Charles D. Miller
Attorney, Agent, or Firm—Staas & Halsey

[57] ABSTRACT

In an AD converting device in which an analog random noise is added by analog adding means to an analog signal to be converted and the added output is converted by an AD converter to a digital signal, an analog offset voltage, whose level variation is around (1 to 7) times the quantization step size $\Delta$ of the AD converter, is generated by offset generating means and is also applied to the analog adding means. A random noise waveform is stored in a memory, the read-out output of which is converted by DA converting means to an analog random noise having an amplitude about ($\frac{1}{2}$ to 6)$\Delta$, and the converted output is used as the above-said random noise. A digital value of the offset voltage and the digital noise waveform are subtracted from the output of the AD converter, as required.

17 Claims, 5 Drawing Sheets

AD CONVERTING DEVICE

BACKGROUND OF THE INVENTION

The present invention relates to an AD converting device which is employed for converting an audio signal, musical signal, image signal, or like analog signal into a digital signal which may be subjected to, for instance, an analysis in the frequency domain and/or time domain.

A quantization error is incidental to an AD conversion because an AD converter has a limited number of quantization steps. Many attempts have been made to average maldistributed quantization errors through application of a dither to an original analog signal by using a random noise, as set forth in, for example, B. A. Blesser, "Digitization of Audio: A Comprehensive Examination of Theory, Implementation, and Current Practice", Journal of Audio Enginnering Society, October 1978, Vol. 26, No. 10.

Figure 1:
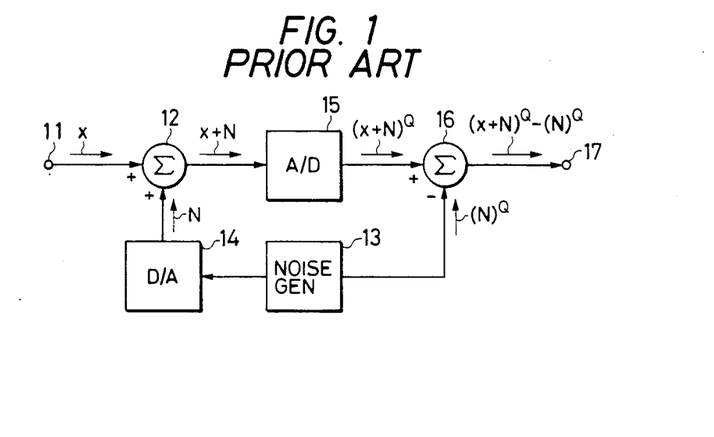
FIG. 1 is a block diagram illustrating a conventional AD converting device.

FIG. 1 shows a prior art example. An analog signal X for conversion into a digital signal is applied to an analog to an analog adder 12 from an input terminal 11. A random pulse generator 13 is provided, which is an M-sequence pulse generator comprising a shift register. Random pulses generated in digital form by the random pulse generator 13 are converted by a DA converter 14 into an analog random noise signal N, which is supplied to the analog adder 12 for addition to the analog signal X. The adder output (X+N) is provided to an AD converter 15, whereby it is converted, at intervals of a fixed period Ts, into a digital signal of a predetermined number of bits.

The converted output $(X+N)^Q$ (where Q indicates that the output is a digital signal) from the AD converter 15 is applied, as required, to a digital subtractor 16, wherein a random noise value $(N)^Q$ supplied from the random pulse generator 13 is digitally subtracted from the converted output $(X+N)^Q$, providing an output $(X+N)^Q-(N)^Q$ at an output terminal 17.

In the conventional AD converting device of the type that superimposes the random noise on the analog signal to be converted, it is possible to distribute quantization errors uniformly over the quantization step size $\Delta$ when the amplitude of the random noise N is selected to exceed about one-half the quantization step size $\Delta$ of the AD converter 15. An increased amplitude of the random noise N will also lessen the influences of the nonlinearity of the quantization characteristic of the AD converter 15 and variations in its quantization step size owing to averaging effects. From this point of view, the random noise N may preferably be large in amplitude.

In the case where the random noise N has a small amplitude but the analog signal to be converted has a large amplitude, small noises will be masked by the signal if it is reproduced into an audio signal. Therefore, the digital subtractor 16 in FIG. 1 can be left out. Furthermore, when the output at the output terminal 17 is subjected to a digital fast Fourier transform (FFT) or digital discrete Fourier transform (DFT) for a frequency analysis, if the random noise N is small, the resultant signal component appearing on the observation screen may have high peaks above the low random noise levels distributed in the analyzing frequency range; and so the random noise is not obstructive to the observation of the signal component. Accordingly, the digital subtractor 16 can be dispensed with in this case, too.

On the other hand, when the amplitude of the random noise is increased as mentioned above, the noise component is distributed uniformly over a wide frequency band with high levels; therefore, it is necessary to remove the random noise component by means of the digital subtractor 16.

Moreover, according to the above prior art system, the random pulses from the random pulse generator 13 are converted by the DA converter 14 into an analog signal. In this case, if the amplitude of the random pulses (noise) is large, the nonlinearlity of the DA converter 14 cannot be ignored in the DA conversion and there arises the necessity of employing an expensive DA converter of a large dynamic range of conversion. Thus, the nonlinearity of the DA converter 14 prevents complete elimination of the random noise in spite of its subtraction by the digital subtractor 16.

Figure 2:
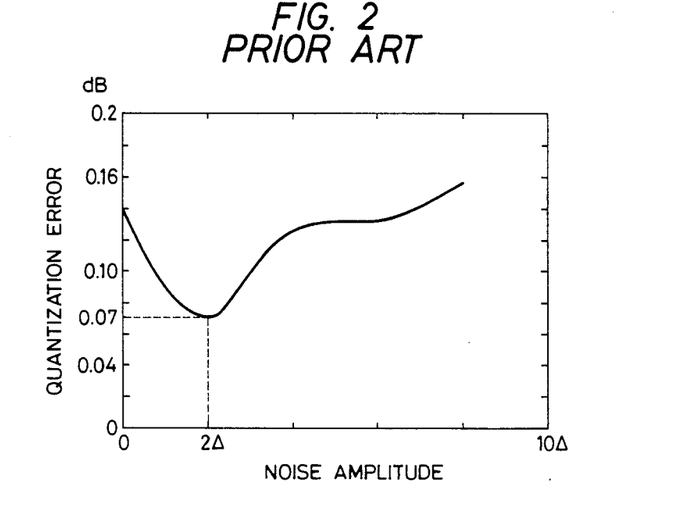
FIG. 2 is a graph showing the relation between the amplitude of a random noise and a quantization error in the AD converting device depicted in FIG. 1.

Incidentally, there are shown in FIG. 2 variations in a quantization error produced when the amplitude of the random noise N was varied in the conventional AD converting device depicted in FIG. 1. The random noise amplitude on the horizontal axis in FIG. 2 is expressed in normalized form with the quantization step size $\Delta$. As will be seen from FIG. 2, an increase in the amplitude of the random noise N causes a decrease in the quantization error, but in this example, the error reaches a minimum value at a noise amplitude of $2\Delta$ and thereafter it is rather on the increase.

SUMMARY OF THE INVENTION

It is therefore an object of the present invention to provide an AD converting device which is relatively simple-structured and low-cost and is able not only to reduce the maldistribution of an quantization error but also to lessen the influences of variations in quantization steps and the nonlinearity of conversion characteristics of the AD converter used.

Another object of the present invention is to provide an AD converting device which dispenses with a digital subtraction of the random noise from the AD converter output.

Yet another object of the present invention is to provide an AD converting device which is capable of lessening the influences of non-uniformity of quantization steps and the nonlinearity of conversion characteristics of the AD converter even if a random noise of a relatively small amplitude is employed.

According to the present invention, an analog random noise is added by analog adding means to an analog signal to be converted to a digital signal, and further, an analog offset voltage of a relatively largely alternating level, which is created by offset voltage generating means, is also added by the analog means to the analog signal to be converted. The analog signal thus added with the analog random noise and the analog offset voltage is converted by an AD converter into digital form.

The alternation level of the analog offset voltage is selected larger than the amplitude of the random noise, in general, about one to seven times the quantization step size $\Delta$ of the AD converter, preferably three to six times, in particular, around four times the quantization step size. The period of variation of the analog offset voltage needs only to satisfy the condition that its frequency spectrum stays outside the frequency band (i.e. the observation frequency region) of the object signal.

When the analog offset voltage takes the form of a square wave, its period of variation is selected to be equal to or sufficiently longer than the conversion period of so-called sampling period Ts of the AD converter, for instance, 256 Ts, and its variation need not be synchronized with sampling by the AD converter. In the case of employing a sine wave as the analog offset voltage, its period is set to be equal to or less than the sampling period Ts; in general, it is selected appreciably higher than the sampling frequency.

The amplitude of the analog random noise is set to 6Δ or less, preferably in the range of Δ/2 to 4Δ or so, or it may be less than Δ/2 in some cases. With a noise amplitude exceeding 10Δ, the nonlinearity of the DA converter for converting the digital random noise into an analog noise poses a problem and a costly DA converter is required in prior art system.

As described above, according to the present invention, since the analog offset voltage is superimposed on the analog signal to be converted, the influence of nonuniformity of the quantization steps and the nonlinearity of the conversion characteristics on the AD conversion can be lessened even if the amplitude of the analog random noise is reduced. In addition, since the spectrum of the analog offset voltage is placed outside the observation frequency range and the amplitude of the analog random noise is small, neither the offset voltage nor the random noise needs to be subtracted digitally from the AD converter output. Of course, the subtraction may also be conducted. Further, a low-cost DA converter with a small number of bits can be employed for producing the analog random noise because its amplitude is small, and a DA converter of excellent conversion linearity is easily available.

Moreover, since the amplitude of the random noise and the level alternation (amplitude) of the offset voltage can be selected in various combinations, the freedom in designing the AD converting device is increased accordingly.

DESCRIPTION OF THE PREFERRED EMBODIMENTS

Figure 3:
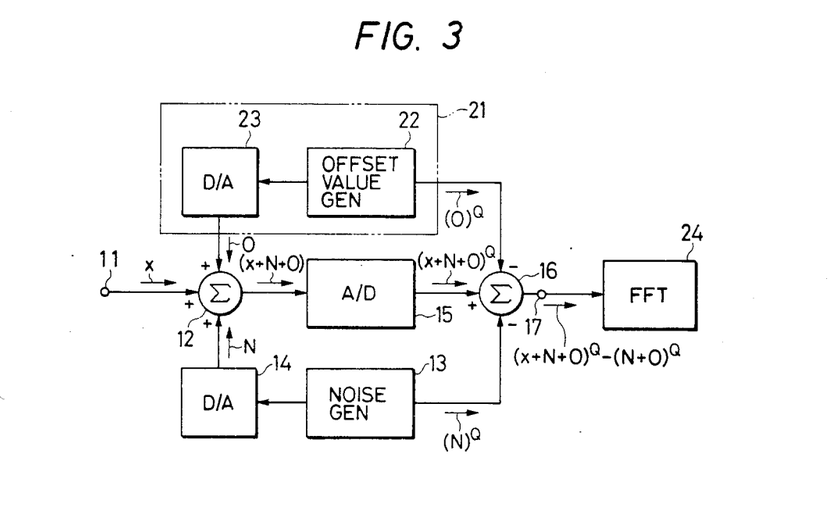
FIG. 3 is a block diagram illustrating an embodiment of the AD converting device of the present invention.
Figure 4:
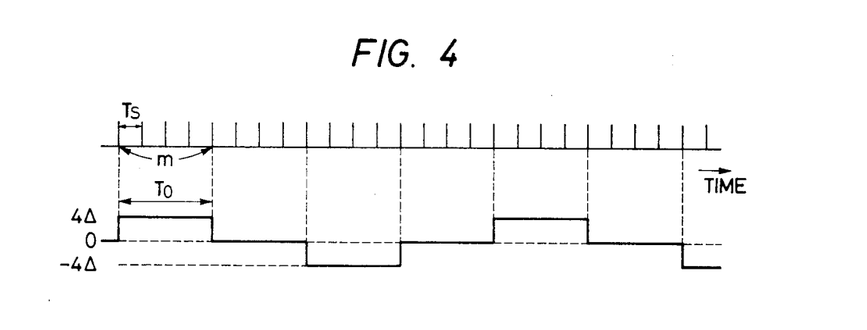
FIG. 4 is a timing chart showing an example of the relation between a sampling clock and an offset voltage.

FIG. 3 illustrates in block form an embodiment of the present invention, in which the parts corresponding to those in FIG. 1 are identified by the same reference numerals. The present invention employs offset generating means 21, which comprises, for instance, offset value generating means 22 for generating an offset voltage value and a DA converter 23 for converting the offset voltage value into an analog voltage. The offset voltage O from the offset generating means 21 is applied to the analog adder 12 in addition to the application of the noise signal N. The offset voltage O is varied more greatly than the quantization step size Δ; namely, it is varied to, for example, $+4\Delta, O, -4\Delta, O, +4\Delta, \ldots$, as shown in FIG. 4. In this case, however, the values of these variations need not always be integral multiples of the quantization step size Δ. The variation period To of the offset voltage O is set to, for instance, m times longer than the sampling period Ts in the AD converter 15. The period To need not necessarily be held constant and synchronized with the sampling period Ts.

The AD converter 15 provides a digital output $(X+N+O)^Q$ converted from the analog adder output $(X+N+O)$. In this example, the digital value $(O)^Q$ of the offset voltage O is also subtracted, by the digital subtractor 16, from the output digital signal $(X+N+O)^Q$ of the AD converter 15, providing a digital signal $(X+N+O)^Q-(N+O)^Q$ at the output terminal 17.

The signal thus obtained at the output terminal 17 of the AD converting device is supplied to, for example, a digital fast Fourier transform unit 24, wherein the signal in the time domain is converted to a signal in the frequency domain, for analysis. Where the analog signal X to be converted into digital form is a repetitive signal, the above-mentioned conversion to the frequency domain is conducted upon each repetition of the input signal X and the corresponding frequency components in the respective conversion results are averaged; this also averages quantization errors.

Figure 5:
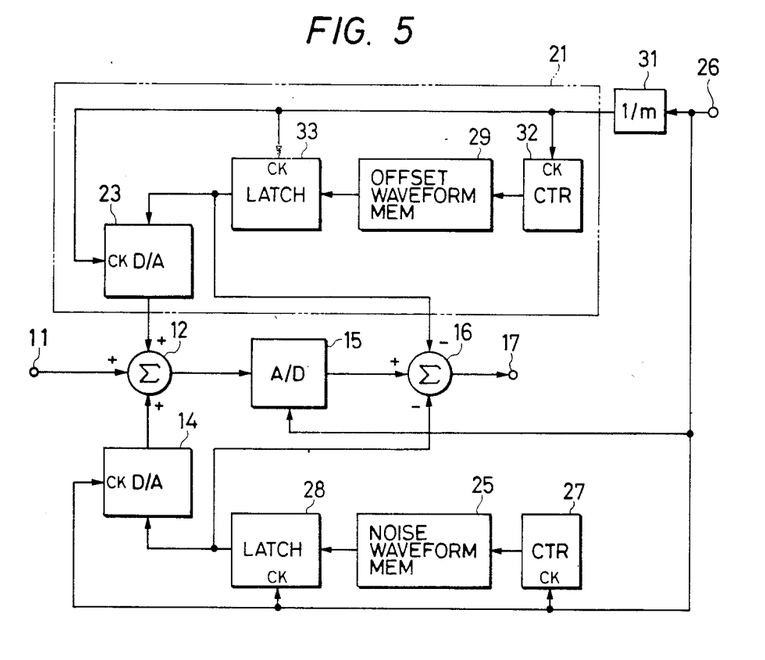
FIG. 5 is a block diagram illustrating another embodiment of the AD converting device which employs waveform memories for generating the random noise and the offset voltage.

FIG. 5 illustrates another embodiment of the present invention. In this embodiment, respective values (sample values) of a random noise waveform are prestored in a random noise waveform memory 25, clock pulses of a frequency Ts from a clock terminal 26 are counted by a ring counter 27, and its count value is used as an address for reading out the memory 25. Each sample value of the random noise waveform read out of the memory 25 is latched in a latch circuit 28, the output of which is converted by the DA converter 14 to an analog signal. Consequently, an analog random noise is obtained from the DA converter 14.

On the other hand, each sample value of an offset waveform is prestored in an offset waveform memory 29, the clock pulses from the terminal 26 are frequency divided by a frequency divider 31 down to 1/m of the clock pulses, and the frequency-divided outputs are counted by a ring counter 32. The count value of the ring counter 32 is used as an address for reading out the offset waveform memory 29. The sample values of the offset waveform thus read out of the memory 29 are latched in a latch circuit 33 by the output of the frequency divider 31. The latch output is converted by the DA converter 23 to analog form, in consequence of which analog offset voltage is obtained from the DA converter 23.

The AD converter 15 performs one converting operation upon each application thereto of the clock pulse from the terminal 26. The digital subtractor 16 is supplied with the outputs from the latch circuits 28 and 33. In the embodiment of FIG. 5, it is necessary, in practice, to provide delay circuits for timing the operations of the respective parts, but no description will be given thereof for the sake of brevity.

Figure 6:
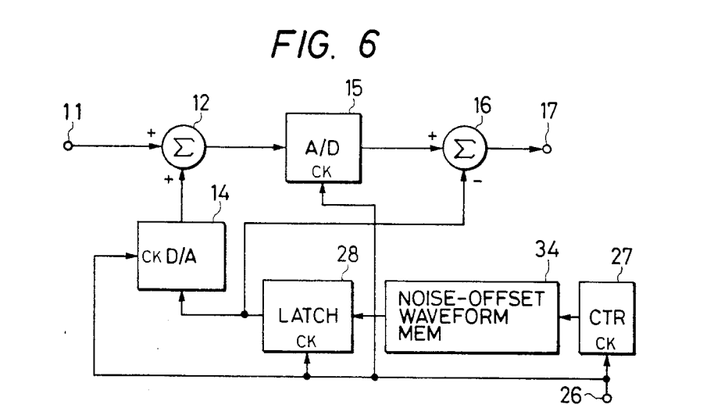
FIG. 6 is a block diagram illustrating another embodiment of the present invention which employs a common waveform memory for producing the random noise and the offset voltage.

FIG. 6 shows a modified form of the embodiment of FIG. 5, in which the random noise and the offset voltage are generated by a common means. In this instance, respective sample values of the random noise waveform and the offset waveform superimposed on each other are prestored in a waveform memory 34, which is read out using the count value of the counter 27, and the read-out output is latched in the latch circuit 28, the output of which is supplied to the DA converter 14.

Figure 7:
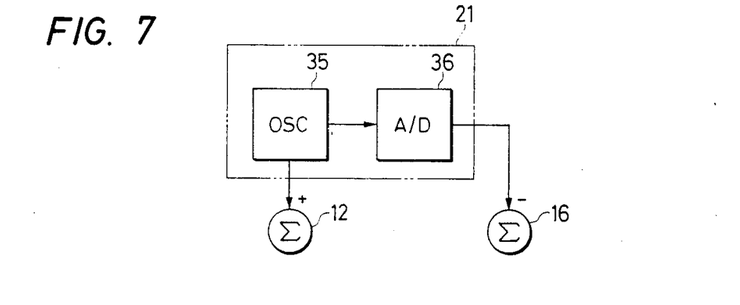
FIG. 7 is a block diagram illustrating another example of the offset voltage generating means.

FIG. 7 illustrates a modification of the offset generating means 21, in which an analog offset voltage is produced directly by a square or sine-wave oscillator 35 and is applied not only to the analog adder 12 but also to an AD converter 36, wherein it is converted to a digital signal for input to the digital subtractor 16. The analog offset voltage is not limited specifically to the square or sine wave but may take other waveforms as well.

Figure 8:
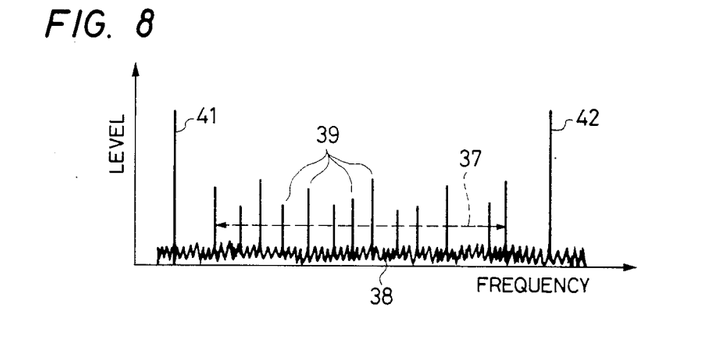
FIG. 8 is a frequency spectrum showing, by way of example, the relations between observation band, a signal to be observed, noise, and the offset voltage component.

Let the case be considered that the output digital signal at the output terminal 17 is converted to a signal of the frequency domain through use of, for example, the FFT unit 24 in FIG. 3. When the frequency region (band) for observation is such as indicated by the broken line 37 in FIG. 8, the frequency spectrum of the analog random noise N is substantially flat in at least the observation region, as indicated by 38, and the noise occurs at random. Where the frequency spectrum 38 of the analog random noise N is sufficiently lower in level than signal components 39 to be observed, as shown, it is not obstructive to the observation of the signal components 39. When the signal components 39 are reproduced into an audio signal, it hears that the noise is almost masked by the high intensity signal components 39; and so there may be no need of the subtraction of the digital random noise (N)$^Q$ by the digital subtractor 16 in the above-described embodiments. Similarly, by suitably selecting the offset voltage such that the frequency component of the offset voltage falls outside the observation band 37, as indicated by 41 or 42 in FIG. 8, the offset component need not be subtracted by the digital subtractor 16 either. Accordingly, the digital subtractor 16 can be dispensed with in these cases. If the levels of the signal components 39 are sufficiently higher than the level of the offset voltage component 41 or 42, the digital subtractor 16 can be omitted also in the case of reproducing the AD converted output at the terminal 17 into an audio signal.

Figure 9:
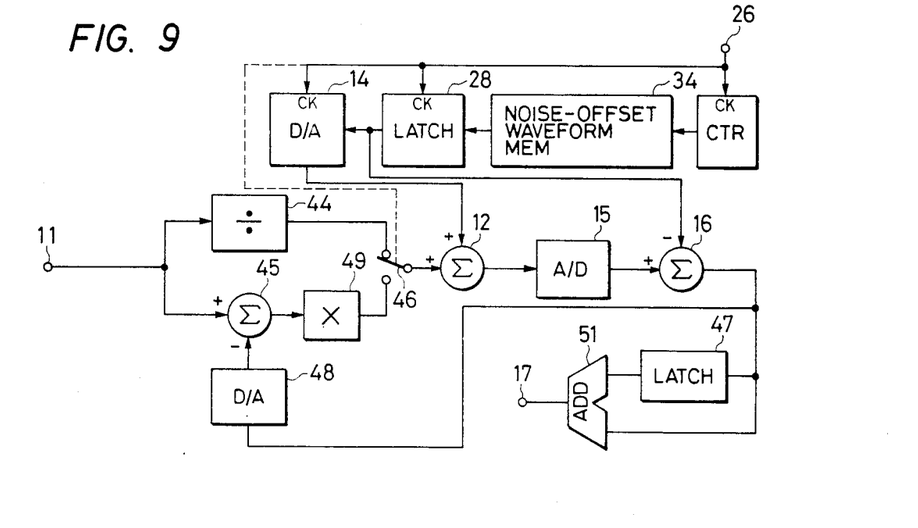
FIG. 9 is a block diagram illustrating an example of the present invention as applied to the case of converting an analog signal into a digital signal in two stages.

It has been proposed to employ a relatively small, high-performance, high-speed AD converter for an AD conversion, in which an analog signal to be converted to digital form is figuratively divided into a high-level portion and a low-level portion in terms of digital value, the both portions are shifted into substantially the same level range and individually converted to digital signals, and then the digital signals are combined into a composite signal after being adjusted in order. This is introduced in, for instance, HEWLETT PACKARD JOURNAL, December 1984, pp. 13–15. Also in such an instance the present invention can be utilized. For example, as shown in FIG. 9, the analog signal from the input terminal 11 is supplied to both an analog divider 44 and an analog subtractor 45. The output of the divider 44 is provided via a changeover switch 46 to the analog adder 12. This is an example of application to the embodiment depicted in FIG. 6, in which the waveform memory 34 is read out, the read out output is converted to an analog signal to create a superimposed voltage of the random noise and the offset voltage, and the superimposed voltage is supplied to the analog adder 12. The output of the analog adder 12 is converted by the AD converter 15 to a digital signal, from which the random noise and the offset component are subtracted by the digital subtractor 16. As a result of this, a component of the digital subtractor output corresponding to the high-level portion of the input analog signal in terms of digital substractor 16. As a result of this, a component of the digital subtractor output corresponding to the high-level portion of the input analog signal in terms of digital value has been shifted to a low level and then converted to a digital signal, which is latched in a latch circuit 47 and, at the same time, it is converted by a DA converter 48 to an analog signal. At this time, the level of the analog signal is returned to the original analog level, and the output of the DA converter 48 is applied to the analog subtractor 45, wherein the high-level portion of the original input analog signal at the input terminal 11 is subtracted by the DA converter output. The level of the remaining low-level portion from the analog subtractor 45 is raised by a multiplier 49, the output of which is provided via the switch 46 to the analog adder 12.

In this arrangement, the dividing number of the divider 44 and the multiplying number of the multiplier 49 are selected such that the full range of the AD converter 15 is utilized most effectively. As described above, the output of the multiplier 49 is also applied via the analog adder 12 to the AD converter 15 for conversion into a digital signal. In the digital subtractor 16 the noise component and the offset component are removed from the converted output, and the subtractor output is supplied to an adder 51, wherein it is combined with the high-level portion previously converted and held in the latch circuit 47, into a composite signal, which is provided to the output terminal 17.

Figure 10:
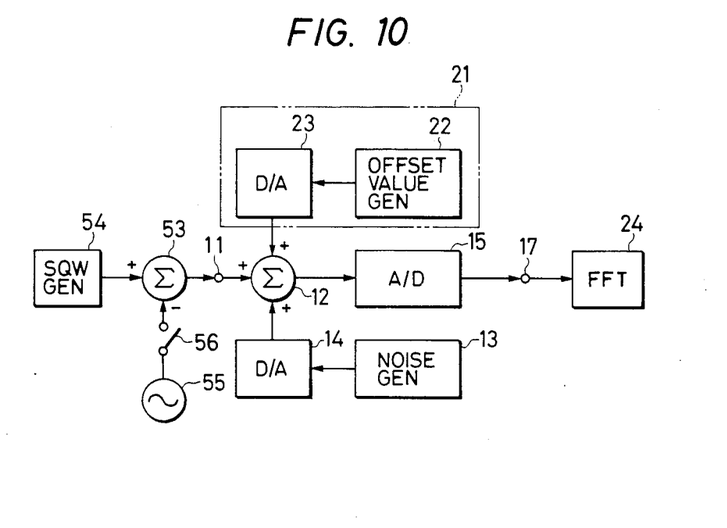
FIG. 10 is a block diagram illustrating an example of a measuring system, for explaining the effect of the present invention.

In order to varify the effect of the present invention, the present inventor conducted the following experiment. As shown in FIG. 10, the output side of an analog subtractor 53 was connected to the input terminal 11 of the AD converting device, and the analog subtractor 53 was connected at one input to the output of a square wave generator 54 and at the other input to the output of a sine wave oscillator 55 via a switch 56. A sine wave of the same frequency and amplitude as those of the fundamental wave of the output square wave of the square wave generator 54 was produced by the sine wave oscillator 55. Incidentally, the digital subtractor 16 was left out.

At first, the switch 56 was turned ON and the outputs of the both DA converters 13 and 23 were set to zero. Consequently, the fundamental wave component of the output from the square wave generator 54 was cancelled by the sine wave from the oscillator 56 and only high-frequency components of the square wave were provided via the analog adder 12 to the AD converter 15. The AD converted output was transformed by the means 24 into a signal of the frequency domain, and the level of each high-frequency component was regarded as a true value.

After this, the switch 56 was turned OFF, the output of the DA converter 23 was held at zero, and the output of the square wave generator 54 was supplied to the analog adder 12 so as to measure, first, the quantization error according to the prior art device. At that time, the output of the DA converter 14 was provided to the analog adder 12, and the amplitude of the output of the DA converter 14, that is, the amplitude of the analog random noise was gradually increased, and then the quantization error of the converted output by the AD converter 15 was measured. The measured results are shown in FIG. 2 as referred to previously. The quantization error is defined as the sum of the differences between the frequency components of the output from the means 24 and the afore-said true values.

Figure 11:
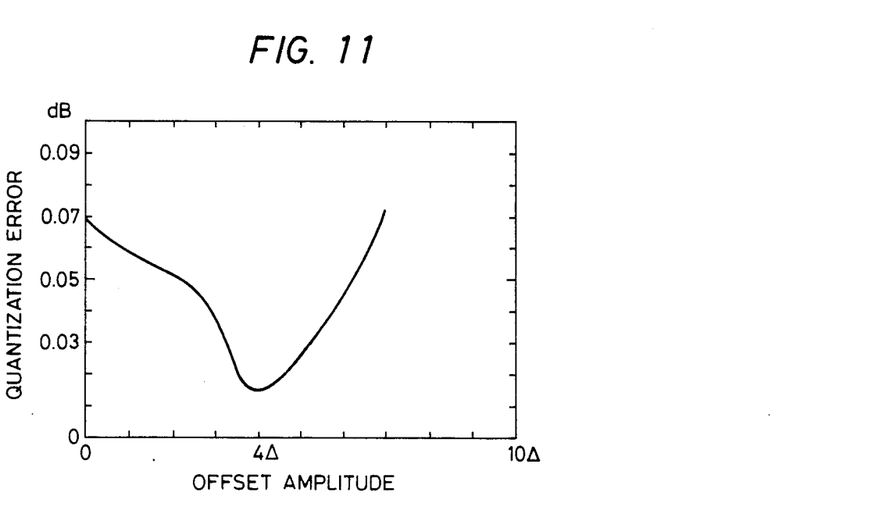
FIG. 11 is a graph showing an experimental example of the relation between the amplitude (level variation) of the offset voltage and a quantization error.

Next, the amplitude of the output from the DA converter 14, that is, the amplitude of the analog offset voltage was gradually increased, starting with zero, while maintaining the amplitude of random noise at $2\Delta$ where the quantization error was minimum as seen in FIG. 2. The measured results of the quantization error with respect to the increase in the offset voltage are such as shown in FIG. 11. As is evident from FIG. 11, an increase in the amplitude of the offset voltage causes a decrease in the quantization error, and when the alternating amplitude of the offset voltage is $\pm 4\Delta$ about zero, the quantization error is minimum. Further, it is seen from FIG. 11 that the amplitude variations in the range of $\pm(\Delta$ to $7\Delta)$ are also effective compared to FIG. 2 for reducing the quantization error and variations in the range of $\pm(3$ to $6\Delta)$ are also appreciably effective.

As described above, according to the present invention, the amplitude of a random noise superimposed on an analog signal to be converted can be decreased even by superimposing on the latter an offset voltage of alternating levels; so that the digital subtractor 16 need not always be provided at the output side of the AD converter 15, as mentioned previously. Furthermore, it is possible to employ, for producing the random noise voltage, a DA converter which is small in the number of bits, small-sized, low-cost, excellent in linearity and high in precision. This ensures correct compensation for cancellation by the digital subtractor 16 if employed. In addition, the use of the offset voltage not only permits uniform distribution of the quantization error but also suppresses the influences of variations in the quantization step size and the nonlinearity of conversion characteristics of the AD converter.

A DA converter with a small number of bits can be used as the DA converter 23 for generating the offset voltage, too. Moreover, since the quantization error is reduced through utilization of both the random noise and the offset voltage, a suitable selection of their amplitudes provides for increased freedom in designing the AD converting device.

It will be apparent that many modifications and variations may be effected without departing from the scope of the novel concepts of the present invention.

What is claimed is:

1. An AD converting device comprising:

random noise generating means for generating an analog randum noise of a relatively small amplitude;

offset generating means for generating an analog offset voltage whose level varies relatively largely;

analog adding means for adding together the analog random noise, the analog offset voltage, and an analog signal to be converted to digital form; and an AD converter for converting the added output of the analog adding means into a digital signal, wherein the level variation of the analog offset voltage is greater than a quantization step size of the AD converter and sufficiently slower than a sampling rate of the AD converter.

2. The AD converting device according to claim 1, wherein the random noise generating means comprises digital random noise generating means for generating a digital random noise and first DA converting means for converting the digital random noise into the analog random noise to be applied to the analog adding means.

3. The AD converting device according to claim 2, wherein the digital random noise generating means includes first memory means for storing a digital random noise waveform, the output read out of the first memory means being supplied as the digital random noise to the first DA converting means.

4. The AD converting device according to claim 3, wherein the offset voltage generating means comprises second memory means for storing a digital offset waveform, and second DA converting means for converting the digital offset waveform into the analog offset voltage.

5. The AD converting device according to claim 4, further including digital subtracting means for subtracting from the output of the AD converter the digital offset waveform read out of the second memory means.

6. The AD converting device according to claim 5, wherein the digital subtracting means performs the subtraction of the digital noise waveform from the output of the AD converter as well.

7. The AD converting device according to claim 6, comprising:

analog dividing means for dividing the level of the input analog signal by a given value; third DA converting means for converting the output of the digital subtracting means into an analog level; analog subtracting means for subtracting the output of the third DA converting means from the input analog signal; switch means selectively supplying the outputs of the analog dividing means and the analog subtracting means to the analog adding means; and combining means for combining the outputs of the digital subtracting means respectively obtainable when the output of the analog dividing means is supplied to the analog adding means and when the output of the analog subtracting means is supplied to the analog adding means, the combined outputs being the output of the AD converting device.

8. The AD converting device according to claim 4, further including means for repeatedly reading out the first memory means in synchronization with first clock pulses of a conversion period of the AD converter and means for repeatedly reading out the second memory means by second clock pulses lower in rate than the first clock pulses.

9. The AD converting device according to claim 1, wherein the offset voltage generating means comprises memory means for storing a digital offset waveform and DA converting means for converting the digital offset waveform to the analog offset voltage.

10. The AD converting device according to claim 9, further including digital substracting means for subtracting from the output of the AD converter the digital offset waveform read out of the memory means.

11. The AD converting device according to claim 10, wherein the digital subtracting means performs the subtraction of the digital noise waveform from the output of the AD converter as well.

12. The AD converting device according to claim 1, wherein the offset generating means is an offset generator for directly generating the analog offset voltage.

13. The AD converting device according to claim 12, further including AD converting means for converting the analog offset voltage from the offset generator into a digital offset signal and digital subtracting means for subtracting the converted digital offset signal from the output of the AD converter.

14. The AD converting device according to any one of claim 1, wherein the amplitude of the analog random noise is selected about ($\frac{1}{2}$ to 6) times the quantization step size $\Delta$ of the AD converter.

15. The AD converting device according to claim 14, wherein the level variation of the analog offset voltage is about (1 to 7) times the quantization step size $\Delta$ of the AD converter.

16. The AD converting device according to claim 1, wherein the level variation of the analog offset voltage is about (1 to 7) times the quantization step size $\Delta$ of the AD converter.

17. An AD converting device comprising:
memory means for storing a digital composite waveform;
readout means for repeatedly reading out the digital composite waveform from the memory means;
DA converter means for converting the digital composite waveform readout from the memory means into an analog composite waveform;
analog adding means for adding the analog composite waveform to an analog signal input to the AD converting device; and
AD converter means for converting the added output of the analog adding means into a digital signal;
wherein the digital composite waveform is a superimposition of a digital random noise waveform and a digital offset waveform, and an analog signal component corresponding to the digital offset waveform in the digital composite waveform has level variation greater than a quantization step size of the AD converter means and a variation period sufficiently longer than a sampling period of the AD converter means.

* * * * *

UNITED STATES PATENT AND TRADEMARK OFFICE
CERTIFICATE OF CORRECTION

PATENT NO. : 4,761,634

DATED : August 2, 1988

INVENTOR(S) : Yamaguchi et al.

It is certified that error appears in the above-identified patent and that said Letters Patent is hereby corrected as shown below:

Claim 1, line 3, "randum" should be --random--.

Signed and Sealed this

Eighteenth Day of October, 1988

*Attest:*

DONALD J. QUIGG

*Attesting Officer*  *Commissioner of Patents and Trademarks*